(12) United States Patent
Lee et al.

(10) Patent No.: US 6,916,680 B2
(45) Date of Patent: Jul. 12, 2005

(54) METHOD FOR FABRICATING IMAGE SENSOR

(75) Inventors: Jae Suk Lee, Icheon-Si (KR); Dae Heok Kwon, Daejeon-Si (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/720,479

(22) Filed: Nov. 25, 2003

(65) Prior Publication Data

US 2004/0171181 A1 Sep. 2, 2004

(30) Foreign Application Priority Data

Dec. 30, 2002 (KR) .................................. 10-2002-0086879

(51) Int. Cl.⁷ .............................................. H01L 21/00
(52) U.S. Cl. ........................................ 438/70; 438/87
(58) Field of Search ............................ 438/70, 87, 93, 438/30, 31, 32, 22

(56) References Cited

U.S. PATENT DOCUMENTS 6,001,540 A * 12/1999 Huang et al. ................ 430/321
6,531,266 B1 * 3/2003 Chang et al. ................ 430/321
6,643,386 B1 * 11/2003 Foster ......................... 382/100

* cited by examiner

*Primary Examiner*—David Nhu
(74) *Attorney, Agent, or Firm*—Pillsbury Winthrop Shaw Pittman LLP

(57) ABSTRACT

A method for fabricating an image sensor comprises forming an over coat layer on an upper face of a semiconductor substrate on which a color filter layer is formed, forming a microlens on the over coat layer; covering the microlens with a protection layer, back grinding a lower face of the semiconductor substrate, and removing the protection layer of the microlens. In this method, the protection layer is formed on the microlens of an image sensor and is subsequently removed after back grinding.

6 Claims, 5 Drawing Sheets

METHOD FOR FABRICATING IMAGE SENSOR

BACKGROUND OF THE INVENTION

1. Field of the Invention

The present invention relates to a method for fabricating an image sensor.

2. Description of Related Art

A recent emerging technology in the field of solid state sensors involves forming image sensors using complementary metal oxide silicon (CMOS) processing. With their ability to electronically duplicate functions of the human eye, CMOS image sensors are capable of acting as highly intelligent information collectors by integrating image processing circuitry on the same chip as the sensor.

A CMOS image sensor includes a photosensitive part, receiving the light and accumulating photocharges, and a logic circuit part, transforming the photocharges into electric signals and generating data. To improve the photosensitivity of the image sensor, there have been continuing endeavors to increase the area ratio (fill factor) of the photosensitive part in the unit pixel to the total area of the image sensor. However, there are fundamental limits in such endeavors, because the logic circuit parts can not be completely eliminated and thus, the photosensitive part exists in a limited area.

One option to address this issue is to use a light-collecting technique. This technique generally employs a microlens system that is built on the upper face of the CMOS device. In this arrangement, the microlens system focuses and concentrates the light onto the photosensitive surface instead of allowing it to fall on non-photosensitive areas of the device.

FIG. 1 represents a cross-sectional view of a CMOS image sensor 100 fabricated in accordance with the related art.

As can be seen in FIG. 1, CMOS image sensor 100 comprises a field insulating layer 102 that is formed on a field area of a semiconductor substrate 101, such as the area of a single crystalline silicon substrate. Image sensor 100 also comprises a unit pixel including a photodiode 103 of a photodetector, which is formed on the active area of the semiconductor substrate 101.

Image sensor 100 further includes a multi-layer interconnect structure constructed on the upper surface of the photodiode. This multi-layer interconnect structure comprises a first interconnect 104, made of polycrystalline silicon and formed on the field insulating layer 102. As shown in FIG. 1, a first dielectric 105, providing electrical insulation between layers, is deposited and planarized on top of the first interconnect 104.

The multi-layer interconnect structure also comprises a second interconnect 106, which is made of aluminum and formed on the first dielectric layer 105. A second dielectric layer 107, which ensures electrical insulation between layers, is deposited and planarized on top of the first dielectric 105 and the second interconnect 106.

Similarly, the multi-layer structure in FIG. 1 further comprises a third interconnect 108, which is made of aluminum and formed on the second dielectric 107. As shown in FIG. 1, a third dielectric layer 109 is deposited and planarized on top of the second dielectric 107 and the third interconnect 108 in order to provide electrical insulation between layers.

Image sensor 100 also comprises a light blockage layer 110 made of aluminum and formed on the third dielectric 109. Image sensor 100 further includes a circular or rectangular opening (not shown in FIG. 1) that is provided in the central area of the light blockage layer 110 so that light can impinge on the photosensitive area 103 of device 100.

As can be seen in FIG. 1, a fourth dielectric 111 is deposited on the upper face of the third dielectric 109 and the light blockage 110. The fourth dielectric 111 acts as a protective layer against external moisture and scratches and can be composed of either a single layer of oxide or nitride or a laminated layer of oxide and nitride.

As also can be seen in FIG. 1, image sensor 100 comprises a color filter 112 of colorant material that is formed on the fourth dielectric 111. Image sensor 100 further includes an over coating material (OCM) 113 of photosensitive material, which is disposed on the color filter 112 and which regulates a focal length of the microlens 114 formed on the OCM. Image sensor 100 finally includes an oxide layer 115 disposed on the microlens 114, which consists, for example, of a low temperature oxide (LTO) SiH4 formed by Plasma Enhanced Chemical Vapor Deposition (PECVD).

In operation, the external light beam, which is incident on the microlens 114, is filtered into several light beams having different wavelengths, (corresponding to, for example, red, green or blue) while penetrating the color filter 112. The filtered light beam then propagates through the multi-layer structure of the image sensor 100 (fourth dielectric 111, third dielectric 109, second dielectric 107, and first dielectric 105) and impinges on the photodiode 103. The characteristics of the image sensor 100 are determined by the light received on the photodiode 103 and depend from the reflection, refraction and absorption coefficients of the microlens 114, OCM 113, color filter 112 and fourth, third, second and first dielectrics 111, 109, 107 and 105 respectively.

Following their manufacture, individual CMOS sensors, which are formed as a chip on a semiconductor substrate, are packaged in order to provide electrical connections to an external system and protection from deleterious environmental factors (e.g., moisture). To facilitate the use of uniformly sized packages and to reduce substrate resistance, semiconductor wafers are usually thinned prior to packaging of the individual semiconductor devices. Such thinning is referred to as "back grinding," since it is conventionally accomplished by mechanically grinding the lower surface (i.e., back) of the semiconductor wafer.

Stress and shocks generated by backgrinding, however, may have a dramatic impact on the characteristics of the CMOS image sensor, and in particular on the microlens. This is due to the fact that during this operation the upper surface of the substrate is firmly grounded to a support, thereby exposing the microlens to scratches and potential fatal shocks. It is therefore crucial to develop new image sensor manufacturing processes wherein the performances of the CMOS sensor are not impacted during back grinding.

SUMMARY OF THE INVENTION

The present invention relates to a method for fabricating an image sensor. The method comprises forming an over coat layer on an upper face of a semiconductor substrate on which a color filter layer is formed, forming a microlens on the over coat layer, covering the microlens with a protection layer, back grinding a lower face of the semiconductor substrate, and removing the protection layer of the microlens.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

In the following description, in order to facilitate a thorough understanding of the invention and for purposes of explanation and not limitation, specific details are set forth, such as the process steps to assemble the CMOS image sensor on the semiconductor substrate. However, it should be understood that the invention may be practiced in other embodiments that depart from these specific details.

Hereinafter, an embodiment of the present invention will be described with reference to the accompanying drawings.

FIGS. 2 to 5 are cross-sectional views showing image sensor fabrication according to one embodiment of the present invention. While only one unit pixel (image sensor) has been depicted on semiconductor substrate 201, it should be apparent to one of ordinary skill in the art that semiconductor substrates 201 may comprise additional unit pixels.

Figure 1:
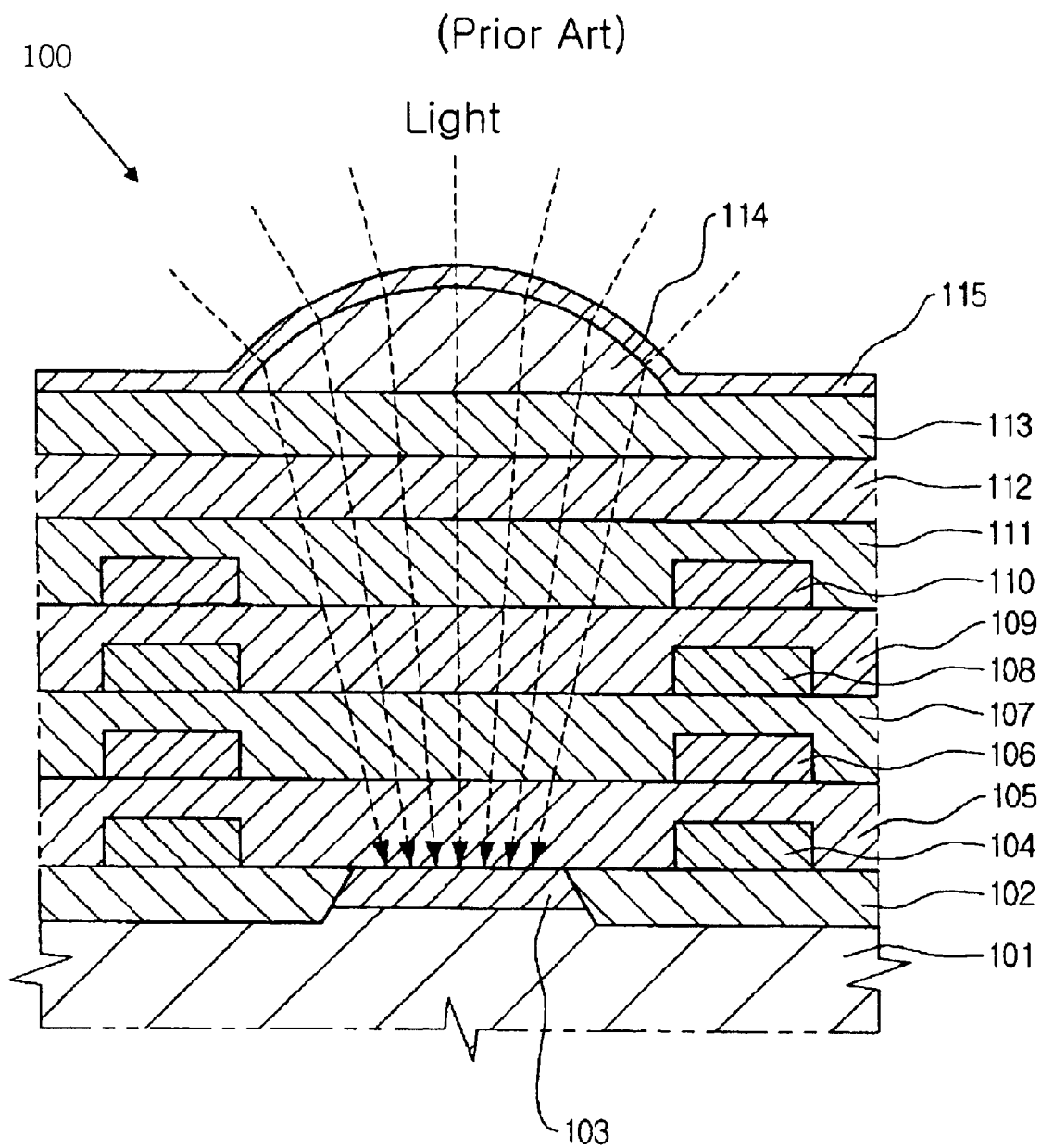
FIG. 1 represents a cross-sectional view of a CMOS image sensor fabricated in accordance with the prior art.
Figure 2:
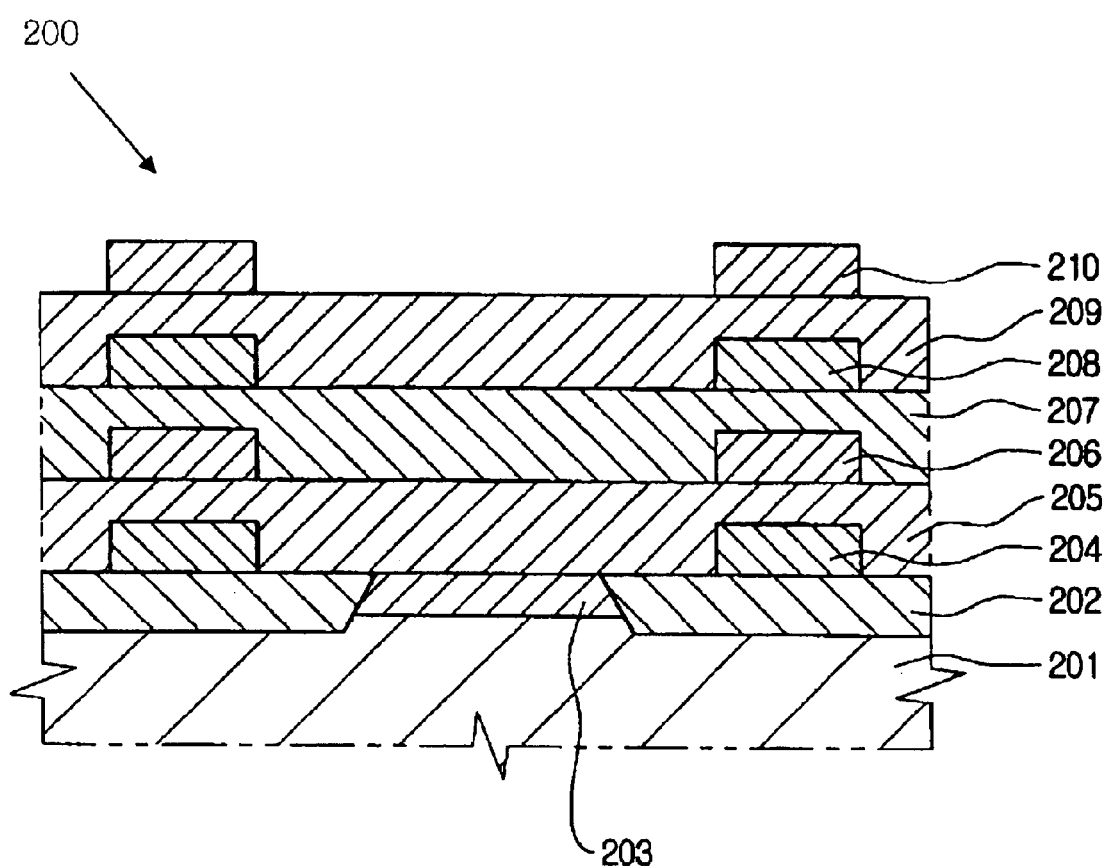
FIGS. 2 to 5 are cross-sectional views showing integrated CMOS image sensor fabrication according to one embodiment of the present invention.

Referring to FIG. 2, the process for fabricating image sensor 200 begins with the formation of a field insulating layer 202. Layer 202 may be formed on a field area of semiconductor substrate 201 and more specifically on a single crystalline silicon substrate. Field insulating layer 202, which ensures electrical insulation between unit pixels, may comprise a field oxide layer that may be formed on substrate 201 using a Shallow Trench Isolation (STI) process. It should be understood, however, that alternative oxidation techniques, such as LOCOS (LOCalized Oxidation of Silicon), may also be used to practice the invention. A unit pixel including a photodiode 203 of a photodetector is then formed on an active area of the semiconductor substrate 201.

The method then proceeds with the construction of a multi-layer interconnect structure on the upper surface of the photodiode. As can be seen in FIG. 2, a first interconnect 204, which may be made of polycrystalline silicon material, is formed on the field oxide layer 202. Formation of the first interconnect 204 may be achieved by conventional processes that will be apparent to one of ordinary skill in the art. Such processes include, but are not limited to, polysilicon deposition, polysilicon photolithography and polysilicon etch. A first dielectric layer 205, providing electrical insulation between layers, is then deposited on top of the interconnect 204. This deposition step may be subsequently followed by a planarization of the dielectric, thereby completing the formation of the Poly-Metal Dielectric layer (PMD).

The method then proceeds with the formation of the second interconnect 206 on the upper surface of the PMD layer. As can be seen in FIG. 2, second interconnect 206 is formed on the first dielectric 205 so as to be positioned above the first interconnect 204. Second interconnect may be made of aluminum or more generally of any materials that provide low resistivity, high reliability and adequate process compatibility. A second dielectric layer 207 is then deposited on the first metal interconnect 206 in order to electrically insulate the interconnect 206 from the upper layers. The second dielectric 207 layer may then be planarized using conventional planarization techniques, thereby completing the formation of the first Inter-Metal Dielectric (IMD) layer.

Formation of the third interconnect and the second Inter-Metal Dielectric may then be pursued using the same techniques discussed in the previous paragraph. That is, a third interconnect 208 is formed on the second dielectric 207 so as to be positioned above the first interconnect 204. Construction of the third interconnect 208 is then followed by deposition of a third dielectric layer 209, as shown in FIG. 2. Similarly, the third dielectric 209, which ensures electrical insulation between adjacent layers, may be subsequently planarized using conventional planarization techniques, thereby completing the formation of the second IMD layer.

The method then proceeds with the deposition of a light blockage layer 210 on the upper surface of the third dielectric 209. In one embodiment of the invention, light blockage 210 may be made of, but is not limited to, aluminum. A circular or rectangular opening (not shown) is then provided in the central area of the light blockage layer 210 so that light can impinge on the photosensitive areas 203 of device 200.

While the structure represented in FIG. 2 comprises a total of three layers of interconnects (first interconnect 204, second interconnect 206 and third interconnect 208), it should be apparent to one of ordinary skill in the art that this number is not intended to limit the scope of the invention. Thus, depending on the characteristics of the device, additional interconnects may be provided in the sensor.

Figure 3:
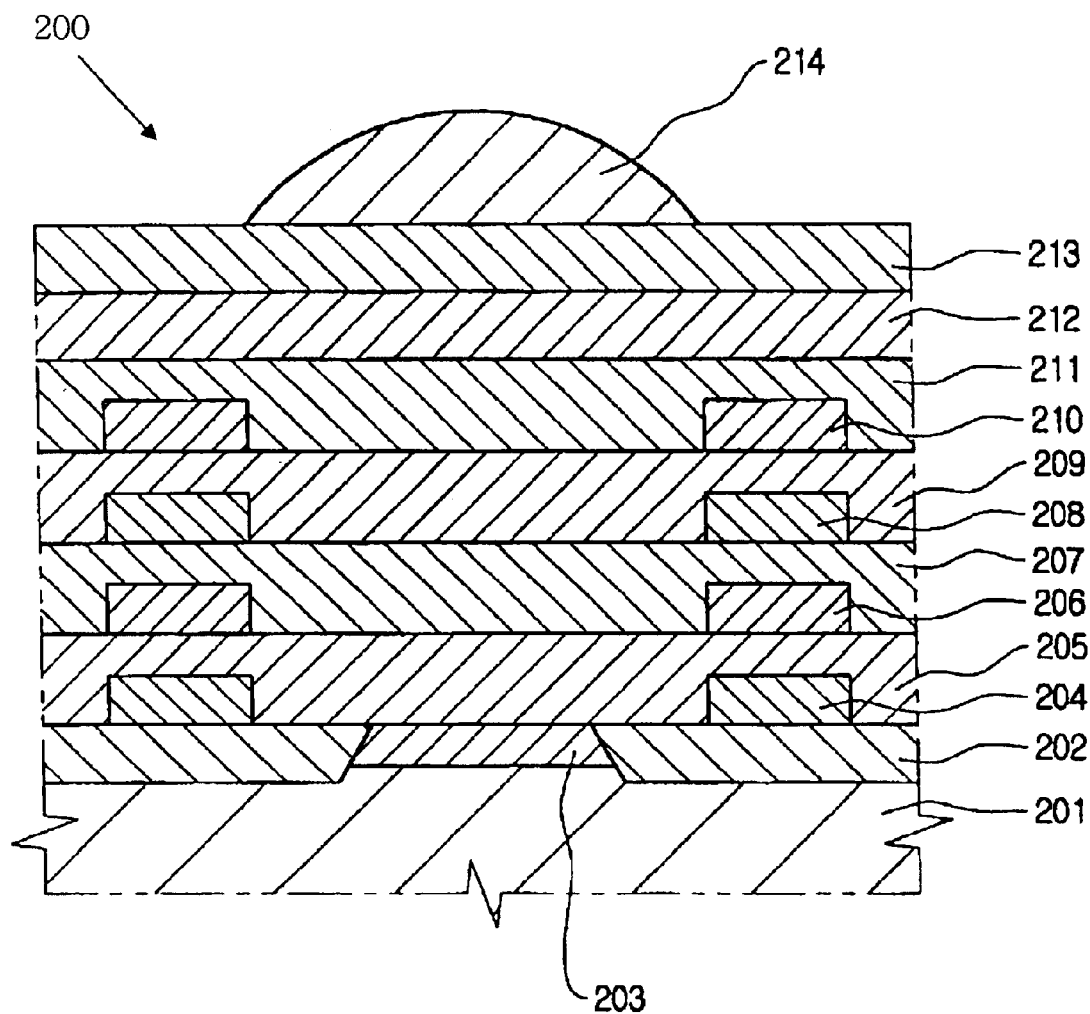

Referring to FIG. 3, the method then proceeds with the deposition of a fourth dielectric 211 on the upper face of the third dielectric 209 and the light blockage layer 210. The fourth dielectric 211 acts as a protective layer against external moisture or scratches. This protective layer can be composed of a single layer of oxide or nitride in one embodiment of the invention, or a laminated layer of oxide and nitride in another embodiment of the invention.

After deposition of the fourth dielectric 211, the method proceeds with the formation of color filter pattern 212. More specifically, color filter pattern 212, which is made of a colorant material, is formed on the fourth dielectric 211 using conventional photolithography techniques. By using a different filter for each photosensor, multiple photosensors can be placed on an IC die wherein each of the photosensors responds to different wavelength ranges, which may include both visible and non-visible ranges. Examples of color filter materials are molecule-dye materials, such as polyimide or pigmented polymer materials.

Still referring to FIG. 3, the method for fabricating a CMOS image sensor, according to one embodiment of the invention, then proceeds with the deposition of an over coating material (OCM) 213 and a microlens 214. The layer of OCM may be composed of photosensitive material and is formed on the upper surface of color filter 212 and fourth dielectric 211. OCM layer 214 acts as a passivation layer, which regulates a focal length of the microlens 214.

In one embodiment of the invention, microlens 214 may be made of photo-imageable acrylic resin material that is spun on the entire semiconductor substrate to a desired thickness for the resulting microlenses. Suitable materials for microlens material include those materials that have transmissitivity across the visible spectrum of light (380–780 nm), and are resistant to aging effects (e.g. oxidation, decomposition), and environmental effects (e.g., moisture uptake, heat resistance)

As mentioned previously, microlens 214 serves to increase the light collecting efficiency of each photosensitive circuit. As can be seen in FIG. 3, the photosensitive element 203 is surrounded by layers of conductive (interconnects lines) and non-conductive (dielectrics) materials, creating a valley effect. As a result, surrounding layers may prevent portion of the light from striking the photosensitive element 203. Therefore, microlens 214 is properly positioned over the OCM layer 213, and the photosensitive circuit, in order to redirect the otherwise obstructed light on element 203.

Figure 4:
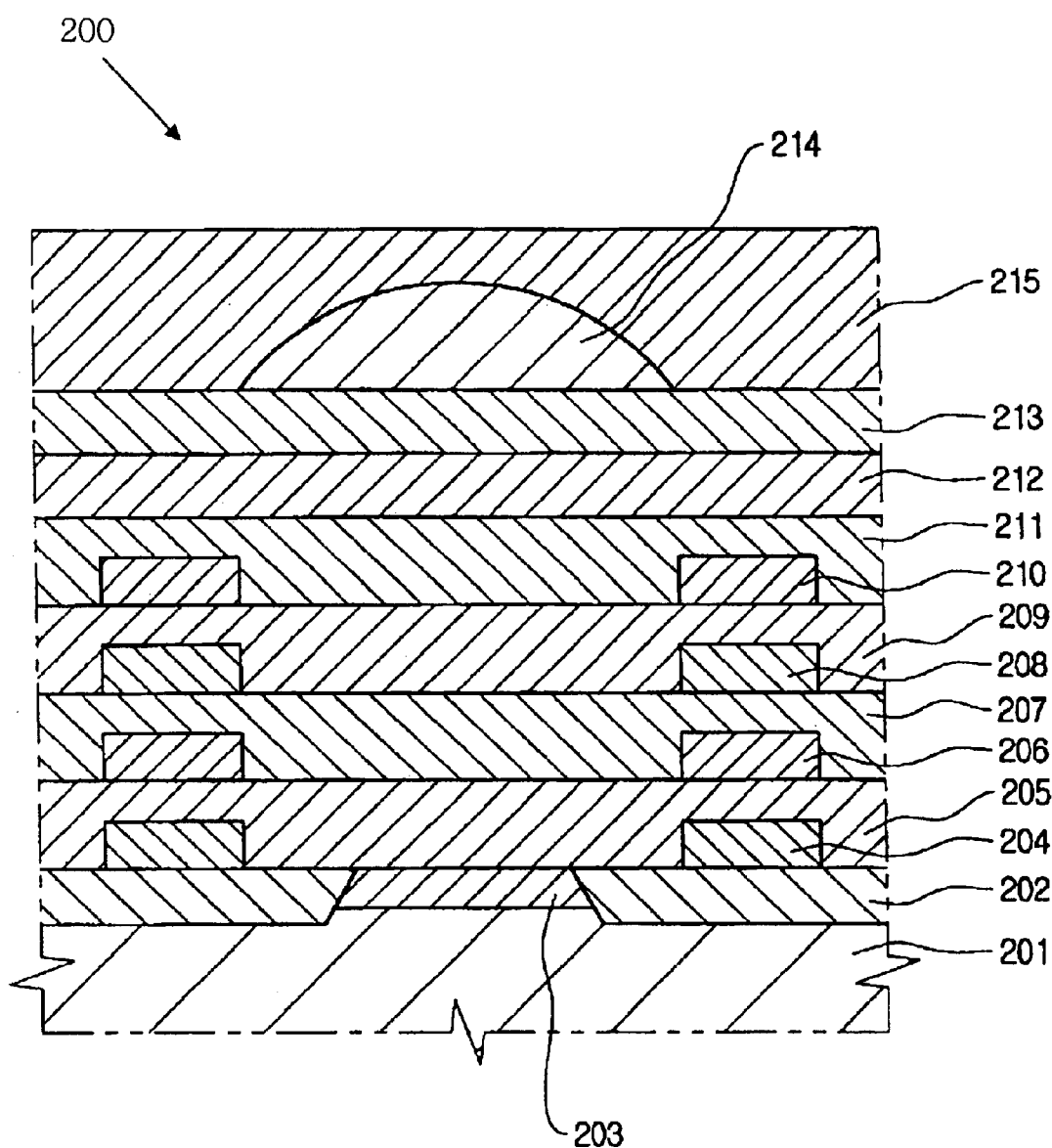

Referring now to FIG. 4, the method then proceeds with the deposition of a protection layer 215 on the upper surface of microlens 214. As shown in FIG. 4, layer 215 can entirely cover lens 214 in order to ensure good protection of the microlens. At the same time, the top of surface layer 215 can be made smooth in order to provide good adhesion of the semiconductor substrate 201 to a support during back grinding. Suitable materials having both good gap-filling and good planarizing properties generally comprise Spin on Glass (SOG) or the like. Therefore, deposition of protection layer 215 may be done, in one embodiment of the invention, by spin coating techniques. In such a case, the deposition of the protection layer may be followed by a curing step to evaporate any casting of solvent. In one embodiment of the invention, temperature of the curing process may be in the range of 150° C. to 300° C. and process time may be around 30 minutes.

Although not illustrated in FIG. 4, the method for fabricating the image sensor then proceeds with back grinding of the semiconductor substrate 201. As mentioned previously, back grinding techniques require that the upper surface of the semiconductor substrate be held by a support. Layer 215 serves as a good protective layer that significantly reduces mechanical shocks on microlens 214.

Figure 5:
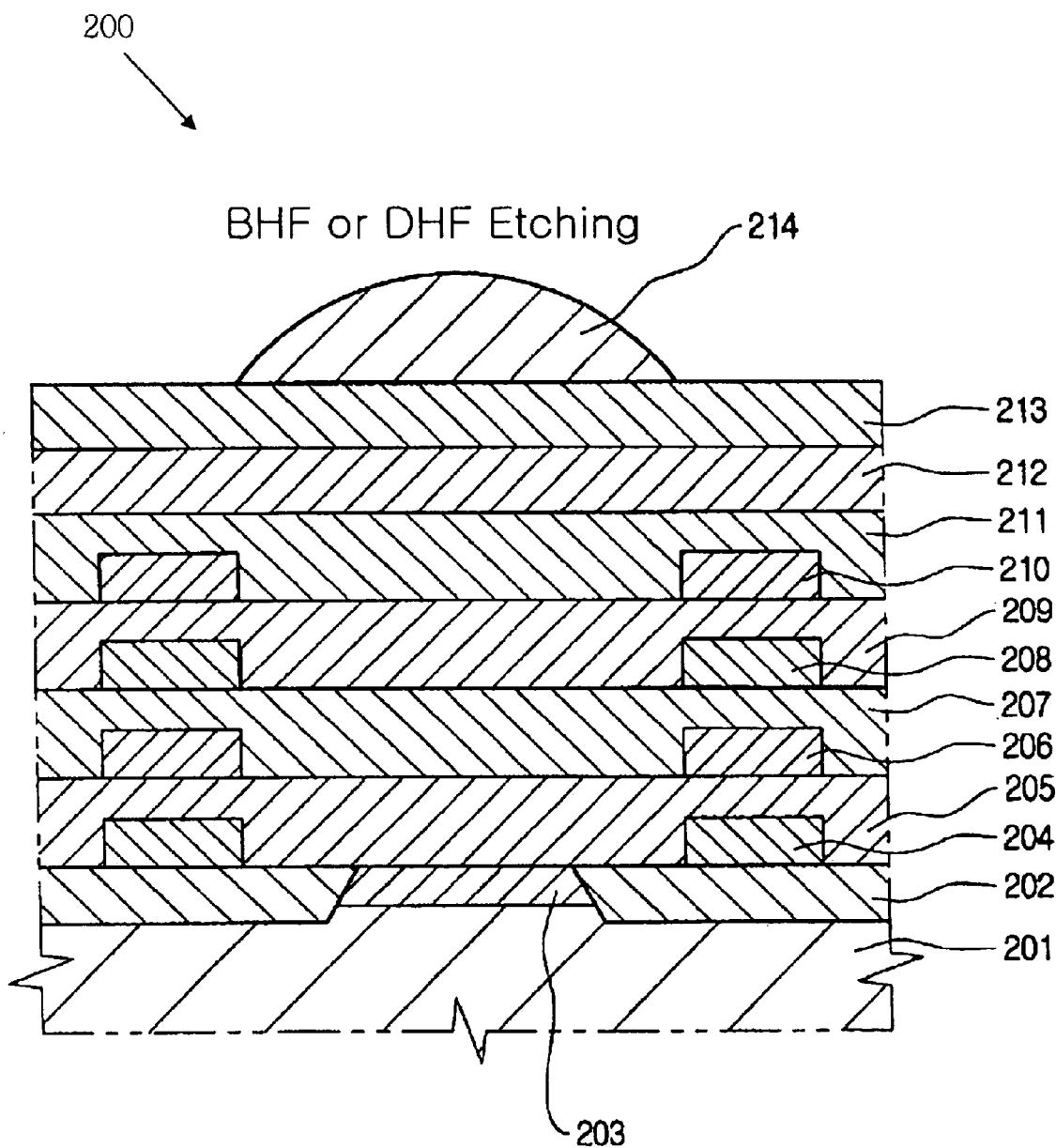

Referring now to FIG. 5, protection layer 215 of the microlens is removed after back grinding. Removal of a SOG protection layer 215 may be done, in one embodiment of the invention, with buffered HF (BHF) or dilute HF (DHF), thus completing the construction of image sensor 200.

According to the present invention, the protection layer 215 is formed on the microlens 214 of an image sensor 200 and subsequently removed after back grinding. As a result, mechanical shocks imposed to microlens 214 are significantly reduced and properties of the microlens are protected during device fabrication.

While a detailed description of several embodiments of the invention have been described above, various alternatives, modifications, and equivalents will be apparent to those skilled in the art without departing from the scope and the spirit of the invention. Therefore, the above description should not be taken as limiting the scope of the invention, which is defined by the appended claims.

What is claimed is:

1. A method for fabricating an image sensor, the method comprising:

forming an over coat layer on an upper face of a semiconductor substrate on which a color filter layer is formed; forming a microlens on the over coat layer; covering the microlens with a protection layer; back grinding a lower face of the semiconductor substrate; and removing the protection layer of the microlens.

2. The method for fabricating the image sensor as claimed in claim 1, wherein the protection layer of the microlens is formed of Spin On Glass (SOG).

3. The method for fabricating the image sensor as claimed in claim 2, wherein the method further comprises curing the protection layer.

4. The method for fabricating the image sensor as claimed in claim 3, wherein a curing temperature of the curing is in a range of 150 to 300° C.

5. The method for fabricating the image sensor as claimed in claim 3, wherein a curing time of the curing is around 30 minutes.

6. The method for fabricating the image sensor as claimed in claim 1, wherein the removing comprises applying one of buffered HF (BHF) and dilute HF (DHF) onto the protection layer.

* * * * *